United States Patent
Ueda

(10) Patent No.: US 9,695,513 B2
(45) Date of Patent: Jul. 4, 2017

(54) HYDROPHOBIZATION TREATMENT APPARATUS, HYDROPHOBIZATION TREATMENT METHOD, AND HYDROPHOBIZATION TREATMENT RECORDING MEDIUM

(71) Applicant: TOKYO ELECTRON LIMITED, Minato-ku (JP)

(72) Inventor: Kenichi Ueda, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 14/837,719

(22) Filed: Aug. 27, 2015

(65) Prior Publication Data
US 2015/0361559 A1    Dec. 17, 2015

Related U.S. Application Data

(63) Continuation of application No. PCT/JP2014/054353, filed on Feb. 24, 2014.

(30) Foreign Application Priority Data

Mar. 1, 2013   (JP) ................................ 2013-040973

(51) Int. Cl.
| | | |
|---|---|---|
| *C23C 16/52* | (2006.01) | |
| *H01L 21/027* | (2006.01) | |
| *H01L 21/02* | (2006.01) | |
| *C23C 16/46* | (2006.01) | |
| *C23C 16/44* | (2006.01) | |

(Continued)

(52) U.S. Cl.
CPC .......... *C23C 16/52* (2013.01); *C23C 16/4412* (2013.01); *C23C 16/4583* (2013.01);
(Continued)

(58) Field of Classification Search
CPC ......... H01L 21/27; H01L 21/00; H01L 23/58; H01L 23/48; H01L 21/0276;
(Continued)

(56) References Cited

U.S. PATENT DOCUMENTS 5,252,807 A * 10/1993 Chizinsky ............... C23C 16/46
                                                118/724
5,493,987 A *  2/1996 McDiarmid ............ C23C 16/04
                                                117/102

(Continued)

FOREIGN PATENT DOCUMENTS

JP     2009-194239 A     8/2009

*Primary Examiner* — Jeffrie R Lund
(74) *Attorney, Agent, or Firm* — Oblon, McClelland, Maier & Neustadt, L.L.P.

(57) ABSTRACT

A hydrophobization treatment apparatus includes a cooling device which cools a substrate, a light irradiation device which irradiates thermal radiation light from light sources onto front surface of the substrate, a gas supply device which supplies hydrophobization-treatment gas to the substrate, an exhaust device which exhausts the gas, a lifting device which moves the substrate such that the lifting device raises and lowers the substrate between the cooling device and light sources, and a control device which has circuitry to control the light irradiation device, the gas supply device, the exhaust device and the lifting device. The circuitry of the control device executes first gas supply control to discharge and exhaust the gas into and from the space between the gas container and substrate, and after the first control, second gas supply control to discharge and exhaust the gas into and from the space between the gas container and substrate.

20 Claims, 9 Drawing Sheets

(51) Int. Cl.
  *C23C 16/458* (2006.01)
  *C23C 16/455* (2006.01)
  *G03F 7/16* (2006.01)
  *H01L 21/67* (2006.01)

(52) U.S. Cl.
  CPC .. *C23C 16/45544* (2013.01); *C23C 16/45565* (2013.01); *C23C 16/46* (2013.01); *C23C 16/463* (2013.01); *G03F 7/16* (2013.01); *H01L 21/0231* (2013.01); *H01L 21/0276* (2013.01); *H01L 21/02304* (2013.01); *H01L 21/67109* (2013.01); *H01L 21/67115* (2013.01)

(58) Field of Classification Search
  CPC ........... H01L 21/0231; H01L 21/02304; H01L 21/67115; H01L 21/67109; B05C 9/10; B05D 3/04; C23C 16/52; C23C 16/463; C23C 16/46; C23C 16/4412; C23C 16/4583; C23C 16/45544; C23C 16/45565; G03F 7/16
  USPC .................. 257/635, 760, E21.273, E21.269, 257/E21.267, E21.001, E21.295, E21.24; 438/757, 758; 118/104, 704, 708, 52, 58, 118/715
  See application file for complete search history.

(56) References Cited

U.S. PATENT DOCUMENTS

| | | | | |
|---|---|---|---|---|
| 5,863,843 A * | 1/1999 | Green | ............... | H01L 21/02238 118/724 |
| 7,462,564 B2 * | 12/2008 | Hamelin | ............. | C23C 16/4405 257/E21.038 |
| 9,318,359 B2 * | 4/2016 | Lim | ................... | H01L 21/67115 |
| 2003/0081945 A1 * | 5/2003 | Kusuda | ................... | C30B 31/12 392/416 |
| 2007/0093071 A1 * | 4/2007 | Verhaverbeke | ............ | G03F 7/16 438/724 |
| 2007/0229657 A1 * | 10/2007 | Kusuda | .................. | G03B 27/42 348/132 |
| 2007/0277735 A1 * | 12/2007 | Mokhlesi | .......... | C23C 16/45527 118/723 R |
| 2007/0281082 A1 * | 12/2007 | Mokhlesi | .......... | C23C 16/45527 427/248.1 |
| 2007/0281105 A1 * | 12/2007 | Mokhlesi | ................ | C23C 16/40 427/569 |
| 2008/0223825 A1 * | 9/2008 | Onishi | .............. | H01L 21/02057 216/58 |
| 2010/0024732 A1 * | 2/2010 | Mokhlesi | .............. | C23C 16/308 118/724 |
| 2010/0101728 A1 * | 4/2010 | Iwasaki | ............. | H01J 37/32192 156/345.33 |
| 2011/0053382 A1 * | 3/2011 | Yanagisawa | .......... | C23C 16/463 438/758 |
| 2011/0121503 A1 * | 5/2011 | Burrows | ............. | C23C 16/4412 269/289 R |
| 2013/0294756 A1 * | 11/2013 | Lim | ................... | H01L 21/67115 392/411 |
| 2014/0231012 A1 * | 8/2014 | Hinode | .................. | C09K 13/04 156/345.23 |
| 2015/0361559 A1 * | 12/2015 | Ueda | .................. | H01L 21/67109 438/758 |

* cited by examiner

HYDROPHOBIZATION TREATMENT APPARATUS, HYDROPHOBIZATION TREATMENT METHOD, AND HYDROPHOBIZATION TREATMENT RECORDING MEDIUM

CROSS-REFERENCE TO RELATED APPLICATIONS

The present application is a continuation of and claims the benefit of priority to International Application No. PCT/JP2014/054353, filed Feb. 24, 2014, which is based upon and claims the benefit of priority to Japanese Patent Application No. 2013-040973, filed Mar. 1, 2013. The entire contents of these applications are incorporated herein by reference.

BACKGROUND OF THE INVENTION

Field of the Invention

The present invention relates to an apparatus, a method and a recording medium for hydrophobizing the front surface of a substrate.

Description of Background Art

JP2009-194239A describes a hydrophobization treatment apparatus equipped with a mounting table, a supply device and an exhaust device along with a control device to control those devices. The control device performs temperature adjustment control to set the temperature of a substrate to a desired level (approximately 23° C.), controls the supply device to feed a hydrophobization-treatment gas to the substrate, and controls the exhaust device to exhaust the hydrophobization-treatment gas. Then, the control device performs another temperature adjustment process to raise the temperature of the substrate (to approximately 90° C.), controls the supply device to feed a hydrophobization-treatment gas to the substrate, and controls the exhaust device to exhaust the hydrophobization-treatment gas. The entire contents of this publication are incorporated herein by reference.

SUMMARY OF THE INVENTION

According to an aspect of the present invention, a hydrophobization treatment apparatus includes a cooling device which cools a substrate and includes a cooling plate positioned to face a back surface of a substrate, a light irradiation device which includes light sources and irradiates thermal radiation light emitted from the light sources onto a front surface of the substrate, the light sources being positioned to face the front surface of the substrate such that a space is formed between the light sources and the front surface of the substrate, a gas supply device which supplies a hydrophobization-treatment gas to the substrate and includes a gas container and gas discharge ports, the gas container covering a lower side of the light sources and positioned to face the front surface of the substrate such that a space is formed between the gas container and the front surface of the substrate, the gas container including a material through which the thermal radiation light emitted from the light sources is permeated, the gas discharge ports being positioned on a lower side of the gas container and formed to open toward the substrate, an exhaust device which exhausts the hydrophobization-treatment gas and includes a gas exhaust outlet formed around a periphery of the substrate, a lifting device which moves the substrate such that the lifting device raises and lowers the substrate between the cooling plate and the light sources, and a control device which has circuitry to control the light irradiation device, the gas supply device, the exhaust device and the lifting device. The circuitry of the control device executes a first gas supply control in which the lift device, the gas supply device and the exhaust device are controlled such that in a position that the substrate is lowered to the cooling plate, a hydrophobization-treatment gas of a first gas supply process is discharged into the space between the gas container and the substrate and exhausted from the space between the gas container and the substrate, and after the first gas supply control, executes a second gas supply control in which the light irradiation device, the lifting device, the gas supply device and the exhaust device are controlled such that in a position that the substrate is raised to the light sources, the light sources emit the thermal radiation light upon the substrate, a hydrophobization-treatment gas of a second gas supply process is discharged into the space between the gas container and the substrate and exhausted from the space between the gas container and the substrate.

According to another aspect of the present invention, a method for applying hydrophobization treatment on a substrate includes discharging a hydrophobization-treatment gas of a first gas supply process into a space formed between a gas container facing a front surface of a substrate and the substrate in a position that the substrate is lowered to a cooling plate, exhausting the hydrophobization-treatment gas of the first gas supply process from the space between the gas container and the substrate, discharging a hydrophobization-treatment gas of a second gas supply process into the space formed between the gas container and the substrate in a position that the substrate is raised to the light sources and the light sources are emitting the thermal radiation light upon the substrate, and exhausting the hydrophobization-treatment gas of the second gas supply process from the space between the gas container and the substrate. The hydrophobization-treatment gas of the second gas supply process is discharged after the hydrophobization-treatment gas of the first gas supply process is exhausted.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
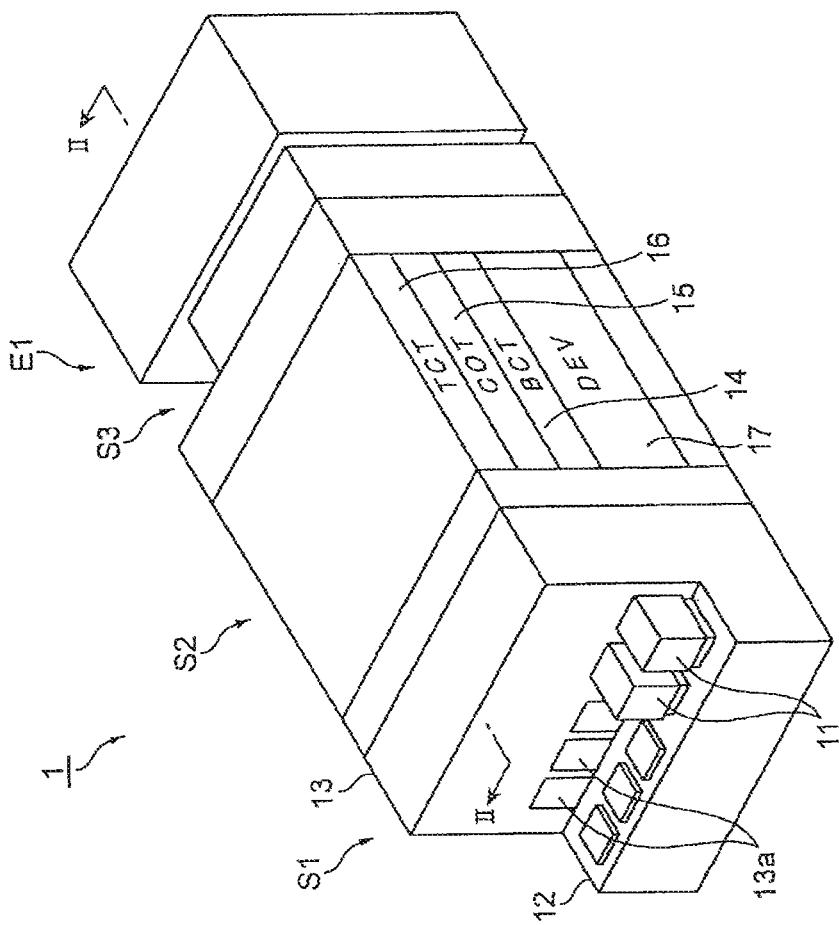
FIG. 1 is a perspective view showing a coating/developing apparatus to which the heating/cooling unit according to an embodiment of the present invention is applied.

The embodiments will now be described with reference to the accompanying drawings, wherein like reference numerals designate corresponding or identical elements throughout the various drawings.

The adhesion unit (hydrophobization treatment apparatus) according to an embodiment of the present invention is a coating/developing apparatus for hydrophobizing the front surface of a wafer, which is a type of substrate. Hydrophobization is a process for increasing the contact angle of a liquid.

Figure 2:
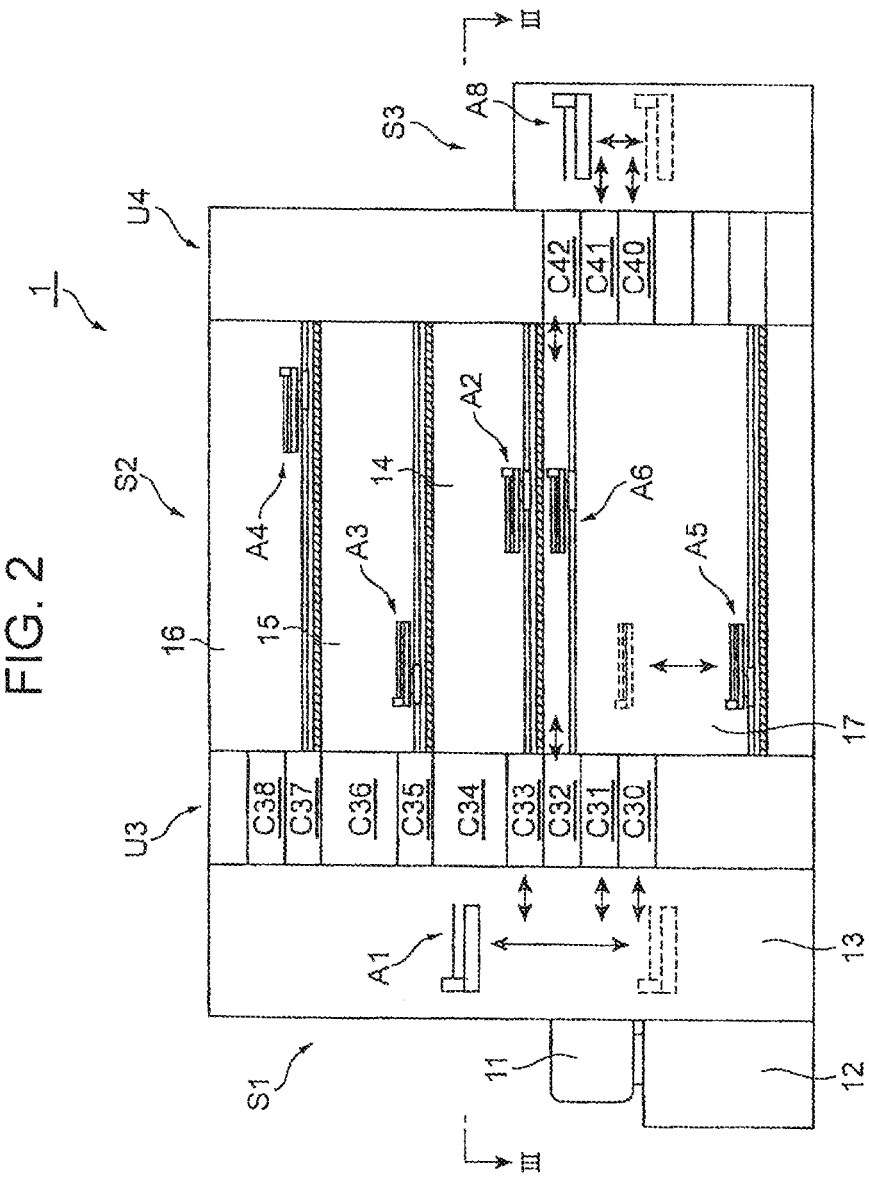
FIG. 2 is a cross-sectional view taken along the II-II line in FIG. 1.
Figure 3:
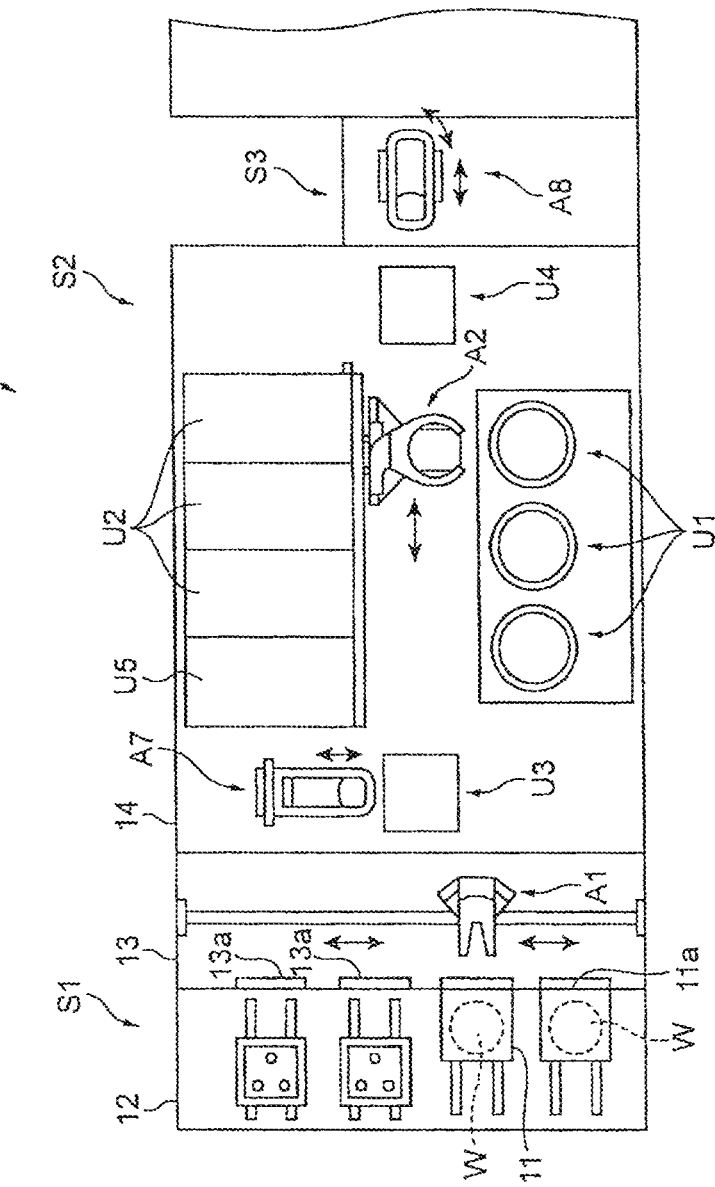
FIG. 3 is a cross-sectional view taken along the line in FIG. 1.

First, a coating/developing apparatus to which the adhesion unit is applied is described. As shown in FIG. 1~3, coating/developing apparatus 1 is equipped with carrier block (S1), processing block (S2) adjacent to carrier block (S1), and interface block (S3) adjacent to processing block (S2). In the following, "front, rear, left and right" used for describing coating/developing apparatus 1 indicates that the front side refers to the direction where interface block (S3) is positioned and the rear side to the direction where carrier block (Si) is positioned.

Carrier block (S1) is provided with carrier station 12 and loading station 13. Carrier station 12 supports multiple carriers 11. Carrier 11 accommodates and seals multiple wafers (W) and is mounted on carrier station 12 to be detachable. Carrier 11 has a door (not shown) provided on one side surface (11a) so as to load/unload wafers (W). Loading station 13 is provided with multiple doors (13a), which open to their respective carriers 11 on carrier station 12. Loading station 13 is also provided with a built-in delivery arm (A1). Delivery arm (A1) unloads a wafer (W) from carrier 11 mounted on carrier station 12, delivers the wafer to processing block (S2), receives a wafer (W) from processing block (S2) and returns the wafer into carrier 11.

Processing block (S2) is provided with bottom antireflection film-forming (BCT) block 14, resist film-forming (COT) block 15, top antireflection film-forming (TCT) block 16, and developing (DEV) block 17. Those blocks are stacked from the floor in the order of DEV block 17, BCT block 14, COT block 15 and TCT block 16.

BCT block 14 accommodates coating unit (U1) to coat a chemical solution for forming antireflection film, heating/cooling unit (U2), adhesion unit (U5), and transfer arm (A2) to transfer a wafer (W) to those built-in units (see FIG. 3). In BCT block 14, a bottom antireflection film is formed on the front surface of a wafer (W). Adhesion unit (U5) performs hydrophobization treatment on the front surface of a wafer (W) where a bottom antireflection film has been formed. COT block 15 accommodates a coating unit (not shown) to coat a chemical solution for forming a resist film, a heating/cooling unit (not shown), and transfer arm (A3) to transfer a wafer (W) to those built-in units. In COT block 15, a resist film is formed on the bottom antireflection film. The same as in BCT block 14, TCT block 16 accommodates a coating unit, heating/cooling unit and transfer arm (A4). In TCT block 16, a top antireflection film is formed on the resist film.

DEV block 17 accommodates multiple developing treatment units (not shown), multiple heating/cooling units (not shown), transfer arm (A5) to transfer a wafer (W) to those built-in units, and direct transfer arm (A6) that transfers a wafer (W) between the front and rear of processing block (S2) without delivering the wafer to any unit therein. The exposed resist film is developed in DEV block 17.

Shelf unit (U3) is provided on the rear side of processing block (S2). Shelf unit (U3) is formed to extend from the floor surface to TCT block 16 and is divided into multiple cells (C30~C38) arranged vertically. Lifting arm (A7) is provided near shelf unit (U3). Lifting arm (A7) transfers a wafer (W) to and from cells (C30~C38). Shelf unit (U4) is provided on the front side of processing block (S2). Shelf unit (U4) is formed to extend from the floor surface to the top of DEV block 17, and is divided into multiple cells (C40~C42) arranged vertically.

Interface block (S3) is connected to exposure-to-light device (E1). Interface block (S3) accommodates delivery arm (A8). Delivery arm (A8) delivers a wafer (W) from shelf unit (U4) in processing block (S2) to exposure-to-light device (E1), and receives the wafer (W) from exposure-to-light device (E1) to return it to shelf unit (U4).

In coating/developing apparatus 1 described above, first, carrier 11 housing multiple wafers (W) is mounted on carrier station 12. At that time, a side surface (11a) of carrier 11 is set to face door (13a) of loading station 13. Next, the door of carrier 11 and door (13a) of loading station 13 are both opened, and wafers (W) in carrier 11 are unloaded one by one and delivered subsequently by arm (A1) to a cell of shelf unit (U3) in processing block (S2).

A wafer (W) transferred to a cell of shelf unit (U3) by delivery arm (A1) is then transferred by lifting arm (A7) to cell (C33), which opens to BCT block 14. The wafer (W) transferred to cell (C33) is then transferred by transfer arm (A2) to coating unit (U1) and heating/cooling unit (U2) in BCT block 14 so that a bottom antireflection film is formed on the front surface of the wafer (W). Next, the wafer (W) with a bottom antireflection film formed thereon is transferred by transfer arm (A2) to adhesion unit (U5) for hydrophobization treatment to be performed on the wafer surface.

When hydrophobization treatment is performed after a bottom antireflection film has been formed, the wafer (W) is transferred by transfer arm (A2) to cell (C34) positioned on cell (C33). The wafer (W) in cell (C34) is transferred by lifting arm (A7) to cell (C35), which opens to COT block 15. The wafer (W) in cell (C35) is transferred by transfer arm (A3) to a unit in COT block 15 and a resist film is formed on the bottom antireflection film of the wafer (W).

When the resist film is formed, the wafer (W) is transferred by transfer arm (A3) to cell (C36) positioned on cell (C35). The wafer (W) in cell (C36) is transferred by lifting arm (A7) to cell (C37), which opens to TCT block 16. The wafer (W) in cell (C37) is transferred to a unit in TCT block 16 by transfer arm (A4), and a top antireflection film is formed on the resist film of the wafer (W).

When the top antireflection film is formed, the wafer (W) is transferred by transfer arm (A4) to cell (C38) positioned on cell (C37). The wafer (W) in cell (C38) is transferred by lifting arm (A7) to cell (C32), which opens for direct transfer arm (A6), and is then transferred by direct transfer arm (A6) to cell (C42) of shelf unit (U4). The wafer (W) in cell (C42) is delivered by delivery arm (A8) in interface block (S3) to exposure-to-light device (E1) so that exposure treatment is performed on the resist film. When exposure treatment is finished, the wafer (W) is transferred by delivery arm (A8) to cell (C40 or C41) beneath cell (C42).

The wafer (W) in cell (C40 or C41) is transferred by transfer arm (A5) to a unit in DEV block 17 to undergo development treatment of the resist film. When the development treatment is finished, the wafer (W) is transferred by transfer arm (A5) to cell (C30 or C31), which opens to DEV block 17 among the cells of shelf unit (U3). The wafer (W) in cell (C30 or C31) is transferred by lifting arm (A7) to a cell to which delivery arm (A1) is accessible and is returned to carrier 11 by delivery arm (A1). The aforementioned structure of coating/development apparatus 1 is simply an example. It is sufficient for a coating/development apparatus to be equipped with liquid processing units such as a coating unit and a development unit, pre- and post-processing units such as a heating/cooling unit, and a transfer device. The number, type and layout of each unit can be modified as desired. In addition, adhesion unit (U5) does not always have to be provided in BCT block 14, and may be provided in COT block 15, for example.

Figure 4:
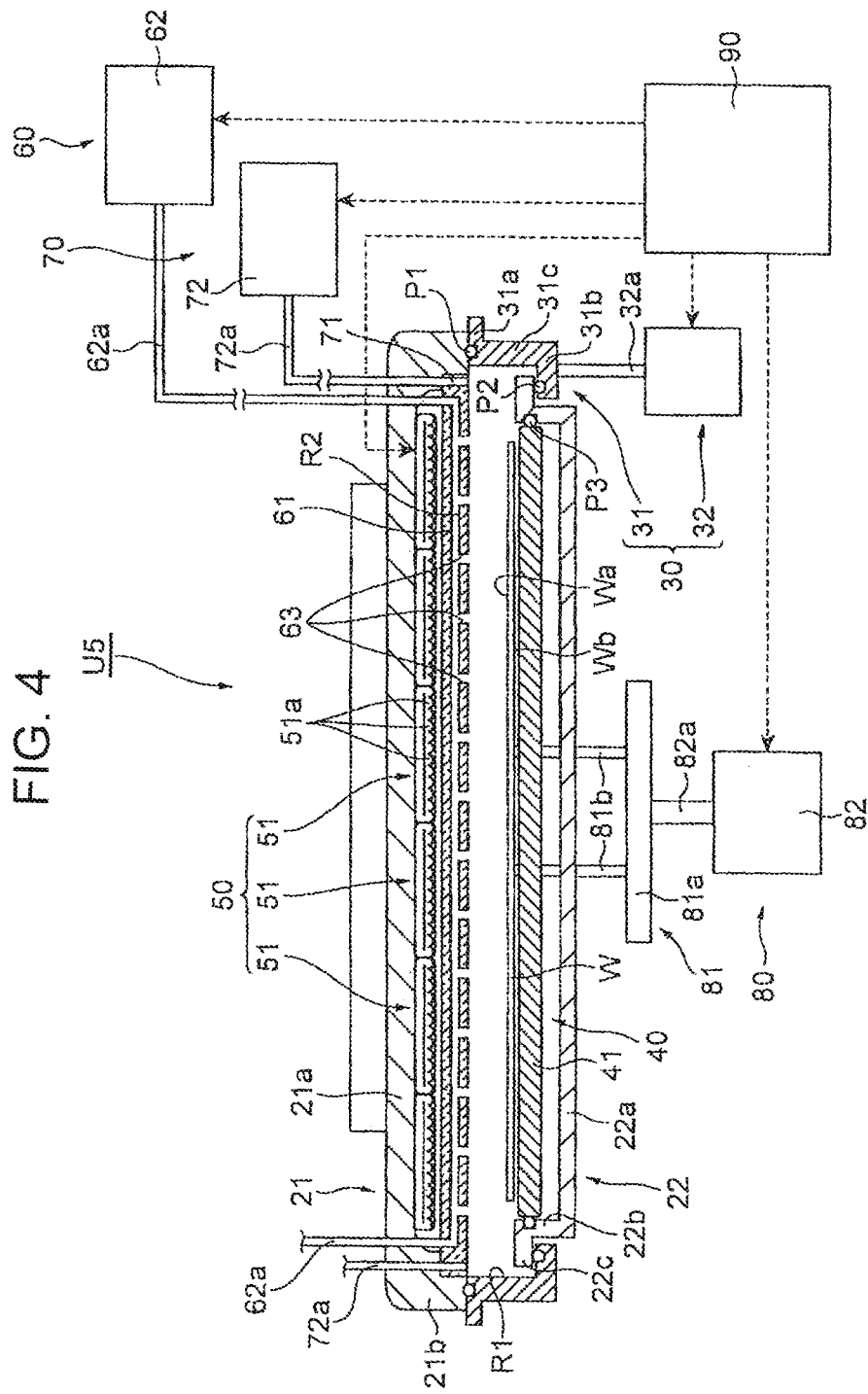
FIG. 4 is a cross-sectional view schematically showing a structure of a hydrophobization treatment apparatus.

Next, adhesion unit (hydrophobization treatment device) (U5) is described in detail. As shown in FIG. 4, adhesion unit (U5) is equipped with upper casing 21, lower casing 22, opening device 30, cooling device 40, light irradiation device 50, gas supply device 60, exhaust device 70, lifting device 80, and control device 90.

Upper casing 21 includes circular top plate (21a) arranged horizontally and peripheral wall (21b) protruding downward from the periphery of top plate (21a). Lower casing 22 includes circular bottom plate (22a) arranged horizontally, peripheral wall (22b) protruding upward from the periphery of bottom plate (22a), and flange (22c) provided on the circumferential upper end of peripheral wall (22b). Lower casing 22 is positioned directly beneath upper casing 21. The outer diameter of lower casing 22 is smaller than that of upper casing 21. Upper casing 21 and lower casing 22 are separated from each other.

Opening device 30, which includes shutter 31 and shutter drive mechanism 32, opens/closes the peripheries of upper casing 21 and lower casing 22. Shutter 31 includes upper flange (31a) abutting upper casing 21 at the lower end of peripheral wall (21b), lower flange (31b) abutting lower casing 22 at the lower surface of flange (22c), and cylindrical peripheral wall (31c) connecting the inner edge of upper flange (31a) and the outer edge of lower flange (31b). Packing (P1) provided for upper flange (31a) seals the gap between the upper surface of upper flange (31a) and the lower end surface of peripheral wall (21b). Packing (P2) is provided for lower flange (31b) and seals the gap between the upper surface of lower flange (31b) and the lower surface of flange (22c).

Shutter drive mechanism 32 is an air cylinder, for example, and has lifting rod (32a) protruding upward. The tip of lifting rod (32a) is fixed to shutter 31. Shutter drive mechanism 32 raises/lowers shutter 31 by using lifting rod (32a).

Upper casing 21, lower casing 22 and shutter 31 work together to form processing space (R1). A wafer (W) to be hydrophobic is positioned horizontally in processing space (R1) with front surface (Wa) facing upward. In the following, when the structures of cooling device 40, light irradiation device 50, gas supply device 60 and exhaust device 70 are described respectively, a "wafer (W)" indicates the wafer (W) positioned in processing space (R1).

Cooling device 40 includes cooling plate 41 and a cooling water circulation pump (not shown). Cooling plate 41, which is fitted to peripheral wall (22b) of lower casing 22 so as to be positioned horizontally, faces back surface (Wb) of a wafer (W). The gap between the outer peripheral surface of cooling plate 41 and the inner surface of peripheral wall (22b) is sealed by packing (P3). A flow channel (not shown) is formed in cooling plate 41 to flow cooling water. The cooling water circulation pump feeds cooling water to one end of the flow channel, cools the water discharged from the other end of the flow channel, and returns the water to the one end of the flow channel. Cooling device 40 cools cooling plate 41 by circulating cooling water so as to cool the wafer (W) positioned on cooling plate 41.

Light irradiation device 50 includes multiple light-emitting plates 51. Light-emitting plate 51 is provided with multiple light sources (51a) formed densely on one surface. Light source (51a) is a light-emitting element to emit light for thermal radiation, and emits light using the electric power supplied from a power supply circuit (not shown). When a wafer (W) is a silicon wafer, the wavelength of the light for thermal radiation is preferred to be 300~1000 nm, for example. Examples of light-emitting elements are LEDs, semiconductor lasers, halogen lamps, xenon flashlights and the like. Multiple light-emitting plates 51 are installed on top plate (21a) by setting light sources (51a) to face downward. Light sources (51a) face front surface (Wa) of a wafer (W) with a gap disposed in between. Multiple light plates 51 are each shaped in a regular hexagon, for example, to form a honeycomb structure and cover the lower surface of top plate (21a).

Gas supply device 60 has gas container 61 and gas supply source 62. Gas container 61 is formed to have a plate-like outline and is made of a material capable of being permeated by light emitted from light sources (51a). Silica glass, for example, may be used as the material to form gas container 61. Since silica glass exhibits high heat tolerance, it is suitable for forming gas container 61 positioned near light sources (51a) for thermal radiation. In addition, silica glass is capable of being permeated by the above-described thermal radiation light.

Gas container 61 is positioned horizontally to close up against the lower edge of upper casing 21 and faces front surface (Wa) of a wafer (W) with a gap in between. The periphery of gas container 61 is fitted against the lower edge of peripheral wall (21b) of upper casing 21 so that gas container 61 covers the lower area of light sources (51a). Buffer space (R2) is formed in gas container 61 to extend horizontally along the front surface of a wafer (W). Buffer space (R2) stores gas. On the lower-surface side of gas container 61, multiple gas discharge ports 63 are formed to communicate with buffer space (R2) and to be open toward wafer (W). Namely, gas supply device 60 is further provided with multiple gas discharge ports 63. Gas discharge ports 63 are formed on the lower surface of gas container 61 and are dotted in the entire region facing a wafer (W).

Gas supply source 62 is connected through supply pipe (62a) to buffer space (R2) and supplies buffer space (R2) with a hydrophobization-treatment gas or inert gas. A hydrophobization-treatment gas is, for example, a mixed gas prepared by mixing a nitrogen gas with a gasified component of HMDS (hexamethyldisilazane). An inert gas is a nitrogen gas, for example. Gas supply device 60 supplies a gas from gas supply source 62 into buffer space (R2) and discharges the gas through gas discharge ports 63 to front surface (Wa) of a wafer (W).

Exhaust device 70 has gas outlet 71 and exhaust pump 72. Gas outlet 71 penetrates through the periphery of gas container 61 and upper casing 21 and opens in processing space (R1) and on the outer side of upper casing 21. Exhaust pump 72 has a built-in electric fan, for example, and is connected to gas outlet 71 through exhaust pipe (72a).

Exhaust device 70 drives exhaust pump 72 to exhaust the gas between gas container 61 and a wafer (W) to the outside of processing space (R1).

Lifting device 80 has lifting component 81 and lifting drive mechanism 82. Lifting component 81 includes lifting plate (81*a*) positioned horizontally below the center of lower casing 22 and three support pins (81*b*) protruding upward from lifting plate (81*a*). FIG. 4 shows only two support pins (81*b*). Three support pins (81*b*) penetrate through bottom plate (22*a*) of lower casing 22 and cooling plate 41, and support the wafer (W) on cooling plate 41. The number of support pins (81*b*) may be four or greater.

Lifting drive mechanism 82 is an air cylinder, for example, and includes lifting rod (82*a*) protruding upward. The tip of lifting rod (82*a*) is fixed to lifting plate (81*a*). Lifting drive mechanism 82 raises/lowers lifting component 81 by using lifting rod (82*a*) so that the wafer (W) supported by support pins (81*b*) is raised/lowered. Namely, lifting device 80 raises/lowers the wafer (W) between cooling plate 41 and multiple light sources (51*a*).

Control device 90 is a computer and includes a display unit (not shown) to display the screen for setting conditions of hydrophobization treatment, an input unit (not shown) to input conditions of hydrophobization treatment, and a reading unit (not shown) to read out the program from a computer-readable recording medium. The recording medium stores a program for control device 90 to execute hydrophobization treatment. The program is read out by the reading unit of control device 90. Examples of a recording medium are hard disks, compact discs, flash memories, flexible disks, memory cards and the like. According to the program read by the reading unit and hydrophobization treatment conditions inputted into the input unit, control device 90 controls opening device 30, cooling device 40, light irradiation device 50, gas supply device 60, exhaust device 70 and lifting device 80 to execute hydrophobization treatment.

Figure 5:
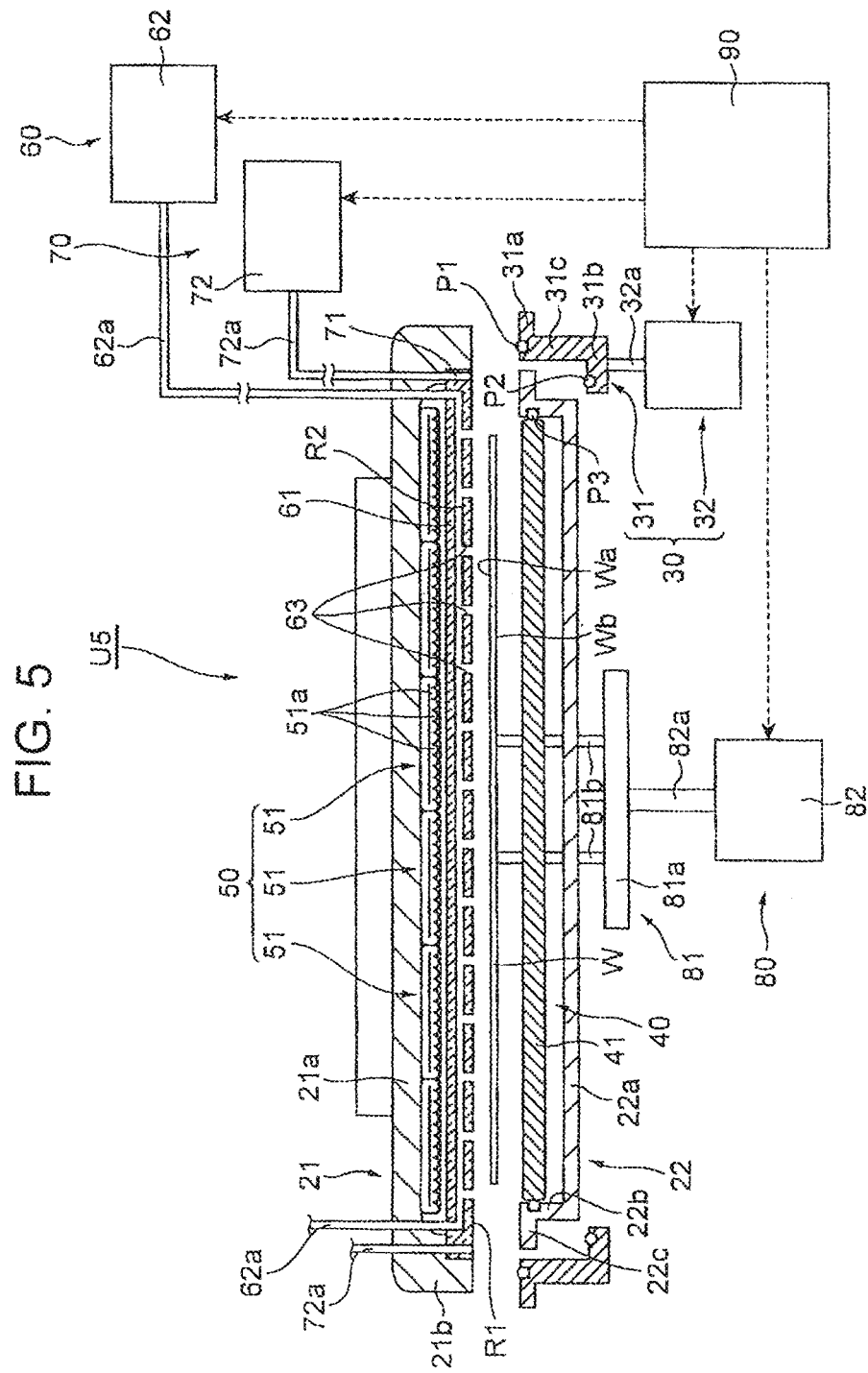
FIG. 5 is a cross-sectional view showing a hydrophobization treatment apparatus shortly after a wafer is loaded into the apparatus.

Hydrophobization treatment to be executed by control device 90 is now described below. First, control device 90 controls opening device 30 to move shutter 31 down so that the space is opened between the peripheries of upper casing 21 and lower casing 22 as shown in FIG. 5. Then, a wafer (W) is loaded into processing space (R1). The wafer (W) is positioned horizontally in processing space (R1) in a way that front surface (Wa) faces upward. Control device 90 controls lifting device 80 to raise lifting component 81 so that the wafer (W) is supported by support pins (81*b*) of lifting component 81. Then, control device 90 controls opening device 30 to raise shutter 31 so that the space between the peripheries of upper casing 21 and lower casing 22 is closed up.

Figure 6:
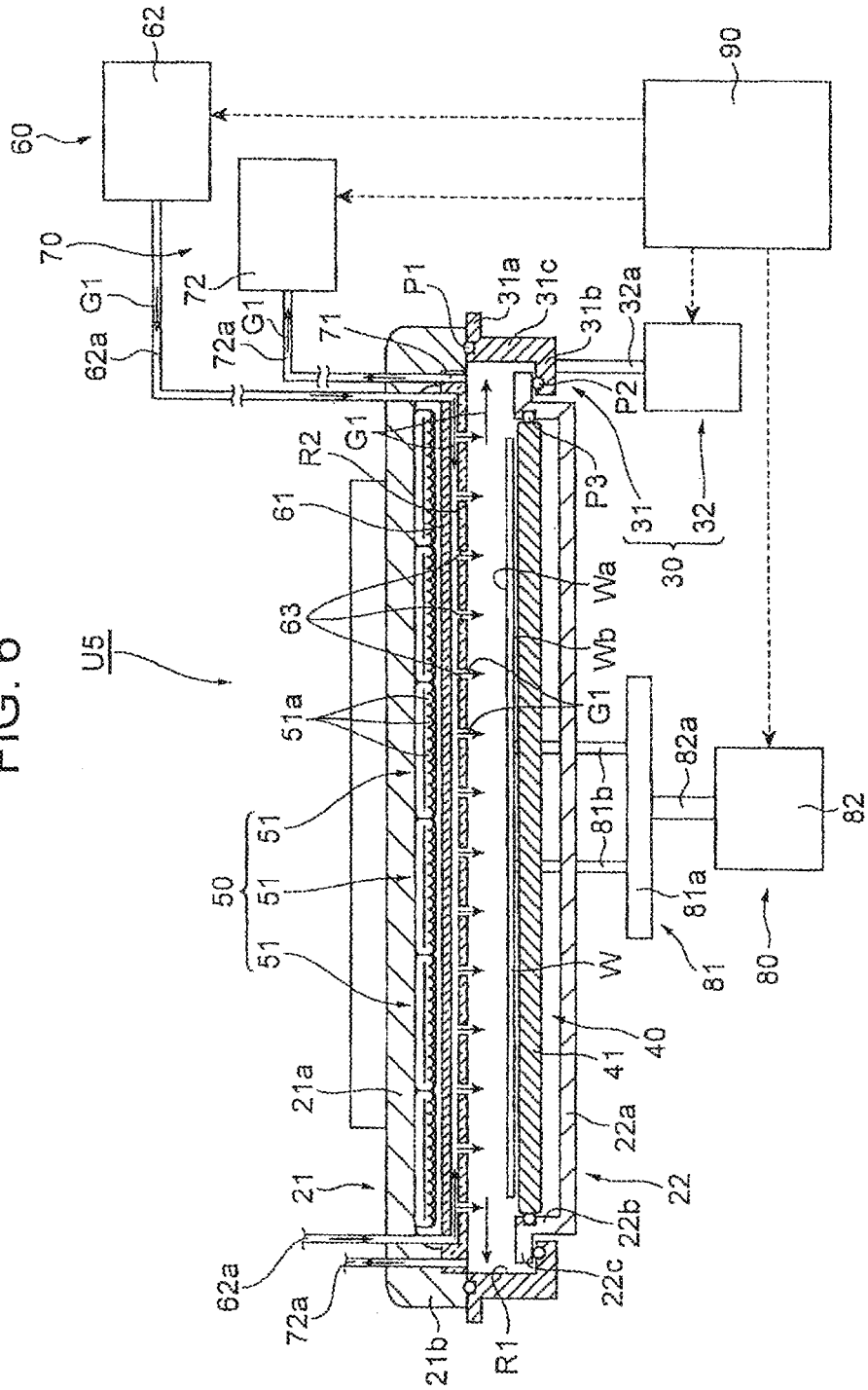
FIG. 6 is a cross-sectional view showing the hydrophobization treatment apparatus during a first gas supply process.

Next, control device 90 performs a first gas supply control (first gas supply process) as shown in FIG. 6. Namely, control device 90 performs control so that a hydrophobization-treatment gas is supplied to front surface (Wa) while the wafer (W) is cooled. More specifically, cooling device 40 is controlled so that the temperature of cooling plate 41 is adjusted to a desired cooling temperature. Meanwhile, lifting device 80 is controlled to move lifting component 81 down so that the wafer (W) comes closer to cooling plate 41. Then, gas supply device 60 is controlled to feed hydrophobization-treatment gas (G1) from gas supply source 62 to buffer space (R2). Hydrophobization-treatment gas (G1) that has flowed into buffer space (R2) is discharged between gas container 61 and the wafer (W) through gas discharge ports 63. Also, control device 90 controls exhaust device 70 to flow the gas to exhaust pump 72 though gas outlet 71. Accordingly, hydrophobization-treatment gas (G1) between gas container 61 and the wafer (W) is exhausted through gas outlet 71. Here, the temperature of a wafer (W) during the first gas supply control is preferred to be, for example, 20~30° C., more preferably 22~24° C.

In the first gas supply control, since the wafer (W) is set near cooling plate 41, the wafer (W) is sufficiently cooled. Under such conditions, the hydrophobization-treatment gas supplied through gas discharge ports 63 of gas supply device 60 flows toward gas outlet 71 of exhaust device 70 and spreads between gas container 61 and the wafer (W). Since the wafer (W) is sufficiently cooled, the hydrophobization-treatment gas is not disturbed by an upward current or the like and spreads well on front surface (Wa) of the wafer (W).

Buffer space (R2) is formed inside gas container 61 to store gas, and all gas discharge ports 63 are set to communicate with buffer space (R2). Accordingly, the gas that has flowed into gas container 61 is distributed to all gas discharge ports 63 through buffer space (R2). As a result, the hydrophobization-treatment gas is distributed even more sufficiently to front surface (Wa) of the wafer (W).

Figure 7:
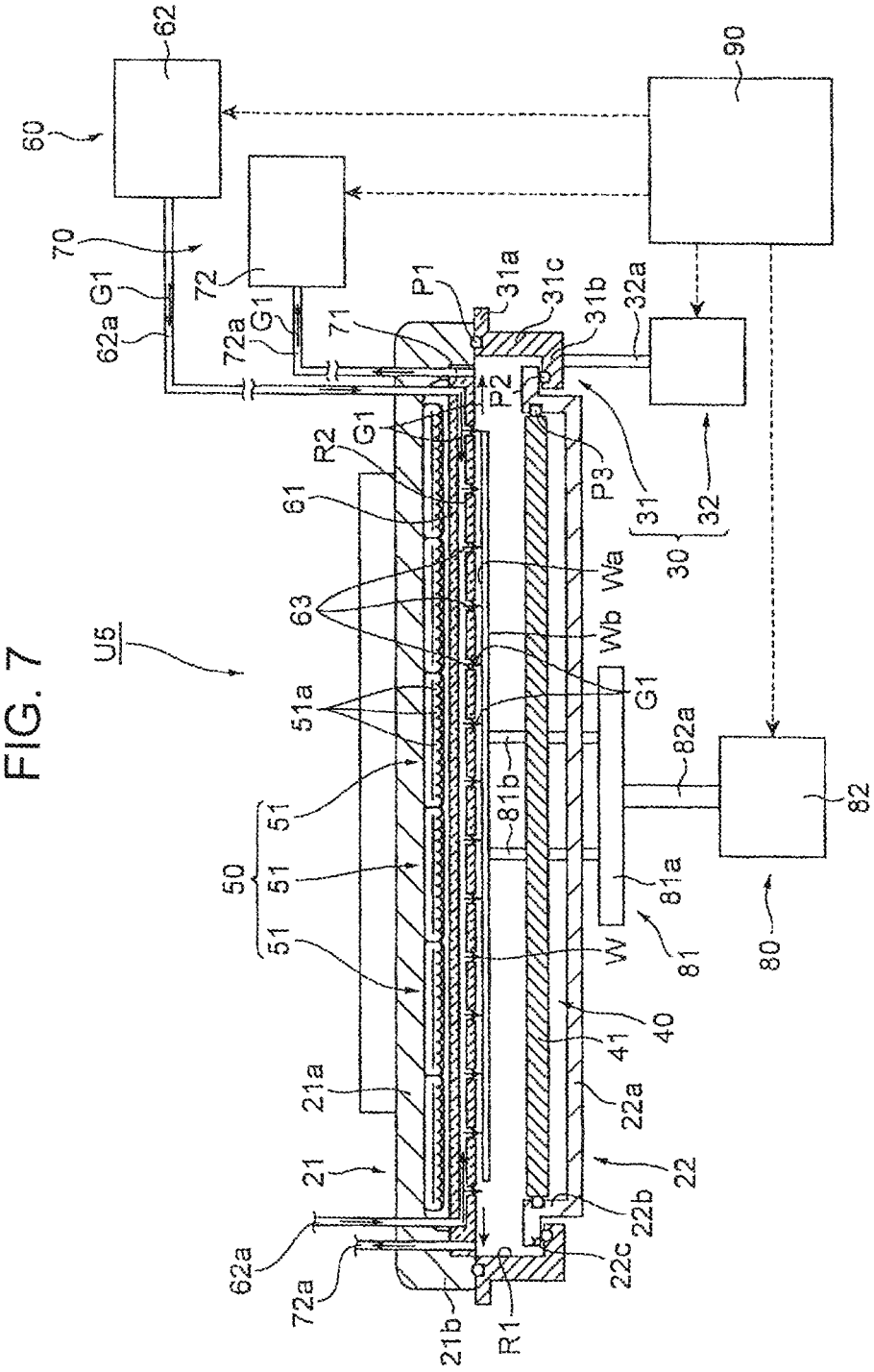
FIG. 7 is a cross-sectional view showing the hydrophobization treatment apparatus during a second gas supply process.

Next, control device 90 performs a second gas supply control (second gas supply process) as shown in FIG. 7. Namely, control device 90 performs control so that a hydrophobization-treatment gas is supplied to front surface (Wa) while the wafer (W) is heated. More specifically, light irradiation device 50 is controlled to turn on light sources (51*a*) to emit light. Lifting device 80 is controlled to raise lifting component 81 so that the wafer (W) comes closer to light sources (51*a*). Lifting component 81 may be raised after light sources (51*a*) start emitting light, or light sources (51*a*) may start emitting light after lifting component 81 is raised. After light sources (51*a*) start emitting light and the wafer (W) is brought closer to light sources (51*a*), gas supply device 60 is controlled so that hydrophobization-treatment gas (G1) is fed from gas supply source 62 to buffer space (R2). Hydrophobization-treatment gas (G1) that has flowed into buffer space (R2) is discharged between gas container 61 and the wafer (W) through gas discharge ports 63. In addition, control device 90 controls exhaust device 70 to flow the gas from gas outlet 71 to exhaust pump 72. Accordingly, hydrophobization-treatment gas (G1) between gas container 61 and the wafer (W) is exhausted through gas outlet 71. Here, the temperature of a wafer (W) during the second gas supply control is preferred to be, for example, 70~180° C., more preferably 90~180° C.

During the second gas supply control, since light sources (51*a*) emit light and the wafer (W) is set near light sources (51*a*), the wafer (W) is sufficiently heated by the thermal radiation light. Under such conditions as well, the hydrophobization-treatment gas supplied through gas discharge ports 63 flows toward gas outlet 71 and spreads between gas container 61 and the wafer (W). Reactions with the hydrophobization-treatment gas are accelerated on front surface (Wa) of well-heated wafer (W), and front surface (Wa) of the wafer (W) is made hydrophobic. When the wafer (W) is heated, an upward current is generated to make it harder for the hydrophobization-treatment gas to reach front surface (Wa) of the wafer (W). However, since the hydrophobization-treatment gas has been fully spread on front surface (Wa) of the wafer (W) during the first gas supply control, front surface (Wa) of the wafer (W) is made sufficiently hydrophobic.

Here, since cooling plate 41 and light sources (51*a*) are respectively set to face each surface of a wafer (W), the wafer (W) is promptly transferred from the cooling plate 41 side toward the light sources (51*a*) simply by raising the wafer (W) using lifting device 80. In addition, since thermal radiation light emitted from light sources (51*a*) permeates through gas container 61 and instantly reaches front surface (Wa) of the wafer (W), the wafer (W) is heated promptly and sufficiently. Therefore, a wafer (W) is well cooled during the first gas supply control, and the first gas supply control is transitioned promptly to the second gas supply control while the wafer (W) is well heated for the second gas supply control. As a result, front surface (Wa) of a wafer (W) is made sufficiently hydrophobic in a short period of time.

Figure 8:
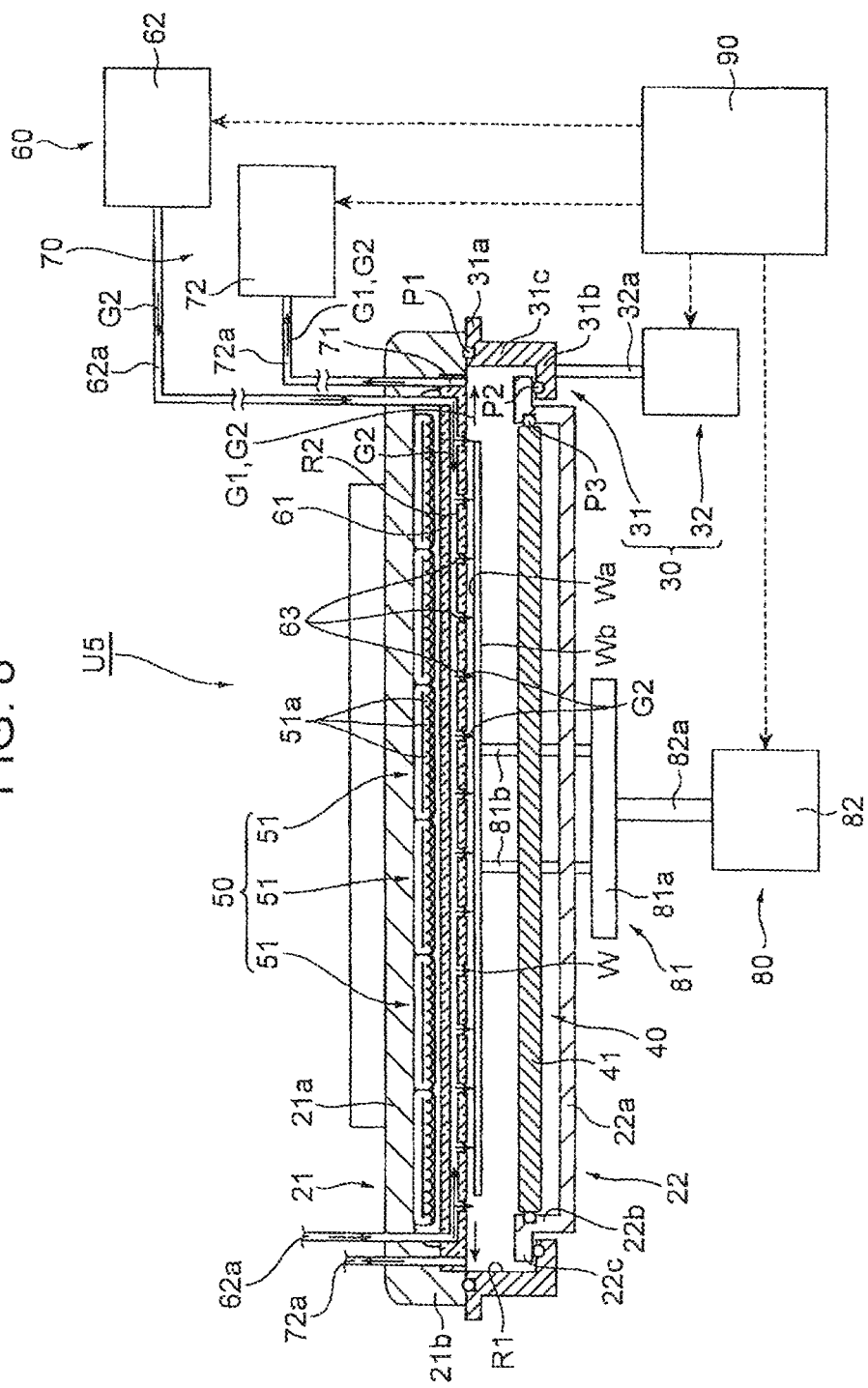
FIG. 8 is a cross-sectional view showing the hydrophobization treatment apparatus during a gas substitution process.

Next, control device 90 performs gas substitution control (gas substitution process) as shown in FIG. 8. Namely, control device 90 performs control so that the hydrophobization-treatment gas between gas container 61 and a wafer (W) is substituted with an inert gas. More specifically, gas supply device 60 is controlled to feed inert gas (G2) from gas supply source 62 to buffer space (R2). Inert gas (G2) that has flowed into buffer space (R2) is discharged between gas container 61 and the wafer (W) through gas discharge ports 63. In addition, control device 90 controls exhaust device 70 to flow the gas to exhaust pump 72 through gas outlet 71. Accordingly, along with hydrophobization-treatment gas (G1), inert gas (G2) between gas container 61 and the wafer (W) is exhausted through gas outlet 71.

In the gas substitution control, control device 90 maintains conditions where light sources (51*a*) emit light and the wafer (W) is positioned near light sources (51*a*). Accordingly, since gas substitution control is conducted while the wafer (W) is near gas container 61, the hydrophobization-treatment gas between gas container 61 and the wafer (W) is promptly substituted with an inert gas. As a result, the front surface of a substrate is made hydrophobic in a short period of time.

Next, control device 90 performs cooling control to cool a wafer (W) (cooling process). More specifically, cooling device 40 is controlled so that the temperature of cooling plate 41 is adjusted to a desired cooling temperature. Lifting device 80 is controlled to move lifting component 81 down so that a wafer (W) is brought closer to cooling plate 41 (see FIG. 6). Subsequently, hydrophobization treatment is completed. Control device 90 controls opening device 30 to move shutter 31 down (see FIG. 5). Accordingly, the space between the peripheries of upper casing 21 and lower casing 22 is opened again, and the wafer (W) is unloaded.

Control device 90 may control exhaust device 70 so that the exhaust rate of the hydrophobization-treatment gas is slower during the second gas supply control than that during the first gas supply control. The exhaust rate means the amount of hydrophobization-treatment gas to be exhausted per unit time. When the first gas supply control transitions to the second gas supply control, the wafer (W) comes closer to gas container 61 as well as to light sources (51*a*), reducing the distance between the wafer (W) and gas container 61. That situation increases the flow rate of the hydrophobization-treatment gas discharged from gas discharge ports 63 and directed toward gas outlet 71. At that time, by reducing the exhaust rate of the hydrophobization-treatment gas, the flow rate of hydrophobization-treatment gas is suppressed from increasing so that the hydrophobization-treatment gas is prevented from passing over front surface (Wa) of the wafer (W) at an overly high flow rate. Accordingly, the wafer (W) is made more sufficiently hydrophobic.

During the second gas supply control, control device 90 may control light irradiation device 50 so that the amount of irradiation light from light sources (51*a*) positioned closer to the center of the wafer (W) is greater than that from light sources (51*a*) positioned near the periphery of the wafer (W). The amount of light irradiation may be increased by extending the irradiation time or enhancing the intensity of light emitted from light sources (51*a*). Since gas discharge ports 63 are set to be open toward the wafer (W) and gas outlet 71 is set at the periphery of the wafer (W), a hydrophobization-treatment gas flows toward the periphery of the wafer (W). In such a gas flow, the hydrophobization-treatment gas tends to have a lower concentration in the center of the wafer (W). Increasing the amount of irradiation light from light sources (51*a*) positioned near the center of the wafer (W) makes up for a lower concentration of the hydrophobization-treatment gas, and the hydrophobization process is thereby suppressed from slowing down. Accordingly, front surface (Wa) of the wafer (W) is made hydrophobic in a shorter period of time.

Figure 9:
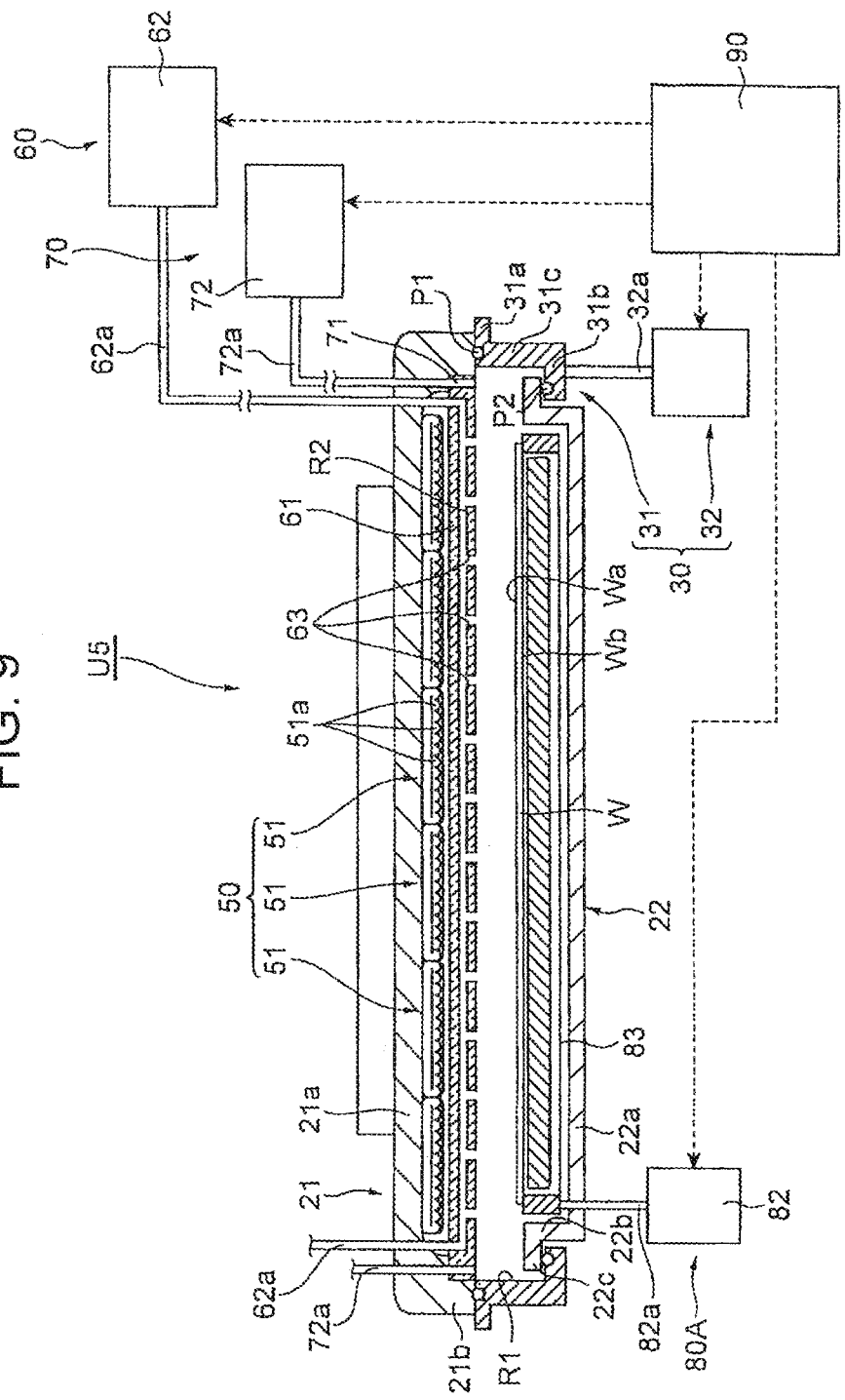
FIG. 9 is a cross-sectional view showing a modified example of a hydrophobization treatment apparatus.

So far, embodiments of the present invention have been described. However, the present invention is not limited to the aforementioned embodiments, and various modifications are possible within a scope that does not deviate from the gist of the invention. For example, lifting component 81 is not limited to having aforementioned support pins (81*b*). For example, lifting device (80A) shown in FIG. 9 has lifting component 83 formed to have an annular shape that goes along the periphery of a wafer (W) so that the periphery of the wafer (W) is supported by lifting component 83. Using such lifting device (80A), lifting component 83 is set to abut the periphery of a wafer (W) during the first and second gas supply controls so that the hydrophobization-treatment gas is prevented from flowing around to back surface (Wb) of the wafer (W).

In a semiconductor production process, a resist pattern for etching is formed on the front surface of a wafer (substrate). A resist pattern is formed by exposing and developing a photosensitive resist film on the front surface of a substrate. To prevent delamination or collapse of a resist pattern, the resist film is firmly bonded to the surface of a substrate. To secure such bonding strength, the front surface of a substrate is set to be hydrophobic before a resist film is formed on the substrate.

When hydrophobization treatment is performed to prevent delamination or collapse of a resist pattern, the substrate is made sufficiently hydrophobic.

During the transition from one gas control to another gas control in a hydrophobization treatment apparatus, if it takes time to increase the temperature, and if it takes time as well to transmit heat from the mounting table to the substrate, the hydrophobization treatment is prolonged and may decrease the throughput of semiconductor production.

According to an embodiment of the present invention, the hydrophobization treatment apparatus and the method for hydrophobization treatment are capable of setting the front surface of a substrate to be sufficiently hydrophobic within a short period of time. According to an embodiment of the present invention, a hydrophobization treatment apparatus to conduct hydrophobization treatment on the front surface of a substrate is equipped with the following: a cooling device, having a cooling plate facing the back surface of a substrate that is positioned with its front surface set upward; a light irradiation device, having multiple light sources positioned to face the front surface of a substrate with a space disposed in between, and structured to turn on the multiple light sources to emit thermal radiation light onto the front surface of the substrate; a gas supply device, having a gas container made of a material capable of being permeated by the light emitted from the light sources and covering the lower side of the light sources to face the front surface of the substrate with a space disposed in between, as well as having multiple gas discharge ports formed on the lower side of the gas container to be open toward the substrate; an exhaust device, having a gas exhaust outlet formed around the periphery of the substrate; a lifting device, structured to raise/lower the substrate between the cooling plate and the light sources; and a control device, structured to control the light irradiation device, gas supply device, exhaust device and lifting device.

The control device executes a first gas supply control by controlling the gas supply device to discharge a hydrophobization-treatment gas between the gas container and the substrate, and by controlling the exhaust device to exhaust the hydrophobization-treatment gas from between the gas container and the substrate, while a substrate is set near the cooling plate by the lifting device. After the first gas supply control, the control device performs a second gas supply control by controlling the gas supply device to discharge a hydrophobization-treatment gas between the gas container and the substrate, and by controlling the exhaust gas to exhaust the hydrophobization-treatment gas from between the gas container and the substrate, while the light sources are turned on to emit light using the light irradiation device, and the substrate is set near the light sources by the lifting device.

According to the hydrophobization treatment apparatus, a substrate is brought near the cooling plate during the first gas supply control so that the substrate is sufficiently cooled. Then, a hydrophobization-treatment gas discharged from the gas discharge ports of the gas supply device flows toward the gas outlet of the exhaust device and spreads between the gas container and the substrate. Since the substrate is well cooled, the hydrophobization-treatment gas is not disturbed by an upward current or the like and spreads sufficiently on the front surface of the substrate.

During the second gas supply control, since the light sources are turned on to emit light and the substrate is set near the light sources, the substrate is sufficiently heated by the thermal radiation light. Under such conditions as well, the hydrophobization-treatment gas discharged through gas discharge ports flows toward the gas outlet and spreads between the gas container and the substrate. Since the substrate is well heated, reactions with the hydrophobization-treatment gas are facilitated on the front surface, and the front surface of the substrate is made hydrophobic. When heated, an upward current is generated on the substrate, making it harder for the hydrophobization-treatment gas to reach the front surface of the substrate. However, since hydrophobization-treatment gas is provided enough on the front surface of the substrate during the first gas supply control, the front surface of the substrate is made sufficiently hydrophobic.

Here, since the cooling plate and the light sources are respectively set to face each surface of a substrate, the substrate is promptly transferred from the cooling plate side toward the light sources simply by raising the substrate by using the lifting device. In addition, since thermal radiation light emitted from the light sources permeates through the gas container and instantly reaches the front surface of the substrate, the substrate is heated promptly and sufficiently. Thus, a substrate is well cooled during the first gas supply control, and the first gas supply control is transitioned promptly to the second gas supply control while the substrate is well heated for the second gas supply control. As a result, the front surface of a substrate is made sufficiently hydrophobic in a short period of time.

The control device may control the exhaust device in a way that the exhaust rate of the hydrophobization-treatment gas is lower during the second gas supply control than during the first gas supply control. When the first gas supply control is transitioned to the second gas supply control, the substrate comes closer to the gas container as well as to the light sources, thereby reducing the distance between the substrate and the gas container. That situation increases the flow rate of the hydrophobization-treatment gas discharged from the gas discharge ports and directed toward the gas outlet. At that time, by reducing the exhaust rate of the hydrophobization-treatment gas, the flow rate of hydrophobization-treatment gas is suppressed from increasing so that the hydrophobization-treatment gas is prevented from passing over the front surface of the substrate at an overly high flow rate. Accordingly, the substrate is made more sufficiently hydrophobic.

During the second gas supply control, the control device may control the light irradiation device so that the amount of irradiation light from the light sources positioned closer to the center of the substrate is greater than that from the light sources positioned near the periphery of the substrate. Since the gas discharge ports are set to be open toward the substrate and the gas outlet is set at the periphery of the substrate, a hydrophobization-treatment gas flows toward the periphery of the substrate. Under such flow conditions, the hydrophobization-treatment gas tends to have a lower concentration in the center of the substrate. Increasing the amount of irradiation light from the light sources positioned near the center of the substrate makes up for a lower concentration of the hydrophobization-treatment gas, and the hydrophobization process is thereby suppressed from slowing down. Accordingly, the front surface of the substrate is made hydrophobic in a shorter period of time.

After the second supply gas control, the control device may further perform gas substitution control while maintaining the state of the substrate positioned near the light sources; namely, the gas supply device is controlled to feed an inert gas between the gas container and the substrate, and the exhaust device is controlled to exhaust the inert gas as well as the hydrophobization-treatment gas from between the gas container and the substrate. During that time, since the gas substitution control is performed when the substrate is set near the gas container, the hydrophobization-treatment gas between the gas container and the substrate is promptly substituted with an inert gas. Accordingly, the front surface of the substrate is made hydrophobic in a shorter period of time.

It is an option to form a buffer space inside the gas container for storing gas and to set all the gas discharge ports to communicate with the buffer space. In such a structure, the gas that has flowed into the gas container goes though the buffer space and is distributed to all the gas discharge ports. Accordingly, the hydrophobization-treatment gas spreads even more sufficiently on the front surface of the substrate.

It is an option for the lifting device to have an annular-shaped lifting component provided along the periphery of the substrate so that the substrate is supported and raised/lowered by such a lifting component. In such a case, the lifting component is set to abut the periphery of a substrate during the first and second gas supply controls, preventing the hydrophobization-treatment gas from flowing around to the back surface of the substrate.

Another embodiment of the present invention is a method for applying hydrophobization treatment that uses the following: a cooling device, having a cooling plate facing the back surface of a substrate that is positioned with its front surface set upward; a light irradiation device, having multiple light sources positioned to face the front surface of a substrate with a space disposed in between, and structured to turn on the multiple light sources for emitting thermal radiation light onto the front surface of the substrate; a gas supply device, having a gas container made of a material capable of being permeated by the light emitted from the light sources and covering the lower side of light sources to face the front surface of the substrate with a space disposed in between, as well as having multiple gas discharge ports formed on the lower side of the gas container to be open toward the substrate; an exhaust device, having a gas exhaust outlet formed around the periphery of the substrate; and a lifting device, structured to raise/lower the substrate between the cooling plate and the light sources.

In the hydrophobization treatment method, a first gas supply process is conducted by controlling the gas supply device to discharge a hydrophobization-treatment gas between the gas container and the substrate, and by controlling the exhaust device to exhaust the hydrophobization-treatment gas from between the gas container and the substrate, while the substrate is set near the cooling plate by the lifting device. After the first gas supply process is finished, a second gas supply process is conducted by controlling the gas supply device to discharge a hydrophobization-treatment gas between the gas container and the substrate, and by controlling the exhaust device to exhaust the hydrophobization-treatment gas from between the gas container and the substrate, while the light sources are turned on to emit light by the light irradiation device and the substrate is set near the light sources by the lifting device.

In the hydrophobization treatment, since the substrate is brought closer to the cooling plate in the first gas supply process, the substrate is well cooled. Under such conditions, the hydrophobization-treatment gas supplied through the gas discharge ports by the gas supply device flows toward the gas outlet of the exhaust device and spreads between the gas container and the substrate. Since the substrate is well cooled, the hydrophobization-treatment gas is not disturbed by an upward current or the like and spreads sufficiently on the front surface of the substrate.

In the second gas supply process, since the light sources are turned on to emit light and the substrate is brought closer to the light sources, the substrate is well heated by the thermal radiation light. Under such conditions, the hydrophobization-treatment gas supplied through the gas discharge ports also flows toward the gas outlet and spreads between the gas container and the substrate. Since the substrate is well heated, reactions with the hydrophobization-treatment gas are accelerated on its front surface, and the front surface of the substrate is made hydrophobic. When the substrate is heated, an upward current is generated to make it harder for the hydrophobization-treatment gas to reach the front surface of the substrate. However, since the hydrophobization-treatment gas has been sufficiently spread on the front surface of the substrate during the first gas supply control, the front surface of the substrate is made sufficiently hydrophobic.

Here, since the cooling plate and the light sources are respectively set to face each surface of the substrate, the substrate is promptly transferred from the cooling plate side toward the light sources simply by raising the substrate using the lifting device. In addition, since thermal radiation light emitted from the light sources permeates the gas container and instantly reaches the front surface of the substrate, the substrate is heated promptly and sufficiently. Thus, a substrate is well cooled during the first gas supply control, and the first gas supply control is transitioned promptly to the second gas supply control while the substrate is well heated for the second gas supply control. As a result, the front surface of a substrate is made sufficiently hydrophobic in a short period of time.

The exhaust rate of a hydrophobization-treatment gas may be set slower during the second gas supply process than during the first gas supply process. When the first gas supply process is transitioned to the second gas supply process, the substrate comes closer to the gas container as well as to the light sources, reducing the distance between the substrate and the gas container. Accordingly, that situation increases the flow rate of the hydrophobization-treatment gas discharged from the gas discharge ports and directed toward the gas outlet. At that time, by reducing the exhaust rate of the hydrophobization-treatment gas, the flow rate of hydrophobization-treatment gas is suppressed from increasing so that the hydrophobization-treatment gas is prevented from passing over the front surface of the substrate at an overly high flow rate. Accordingly, the substrate is made more sufficiently hydrophobic.

During the second gas supply process, the amount of light emitted from the light sources positioned closer to the center of the substrate may be set greater than that from the light sources positioned near the periphery of the substrate. Since the gas discharge ports are set to be open toward the substrate, and the gas outlet is set at the periphery of the substrate, a hydrophobization-treatment gas flows toward the periphery of the substrate. In such a gas flow, the hydrophobization-treatment gas tends to have a lower concentration in the center of the substrate. Increasing the amount of irradiation light from the light sources positioned near the center of the substrate makes up for a lower concentration of the hydrophobization-treatment gas, and the hydrophobization process is thereby suppressed from slowing down. Accordingly, the front surface of the substrate is made hydrophobic in a shorter period of time.

After the second gas supply process, a gas substitution process may further be conducted by controlling the gas supply device to discharge an inert gas between the gas container and the substrate, and by controlling the exhaust device to exhaust the inert gas along with the hydrophobization-treatment gas from between the gas container and the substrate, while maintaining the position of the substrate to be near the light sources. During such a process, since the gas substitution process is performed while the substrate is set near the gas container, the hydrophobization-treatment gas between the gas container and the substrate is promptly substituted with an inert gas. Accordingly, the front surface of the substrate is made hydrophobic in a shorter period of time.

It is an option to use a gas supply device where a buffer space is formed inside the gas container for storing gas and all the gas discharge ports are set to communicate with the buffer space. In such a structure, the gas that has flowed into the gas container goes though the buffer space and is distributed to all the gas discharge ports. Accordingly, the hydrophobization-treatment gas spreads even more sufficiently on the front surface of the substrate.

It is an option to use a lifting device where an annular-shaped lifting component is provided along the periphery of the substrate so that the substrate is supported and raised/lowered by such a lifting component. In such a case, the lifting component is set to abut the periphery of a substrate during the first and second gas supply controls so that the hydrophobization-treatment gas is prevented from flowing around to the back surface of the substrate.

Yet another embodiment of the present invention is a computer-readable recording medium that stores a program for conducting hydrophobization treatment so that the hydrophobization treatment apparatus can carry out the method for the aforementioned hydrophobization treatment.

Using an apparatus, a method and a recording medium according to embodiments of the present invention, the front surface of a substrate is made sufficiently hydrophobic in a short period of time.

Obviously, numerous modifications and variations of the present invention are possible in light of the above teachings. It is therefore to be understood that within the scope of the appended claims, the invention may be practiced otherwise than as specifically described here.

What is claimed is:

1. A hydrophobization treatment apparatus, comprising:
a cooling device configured to cool a substrate and comprising a cooling plate positioned to face a back surface of a substrate;
a light irradiation device comprising a plurality of light sources and configured to irradiate thermal radiation light emitted from the plurality of light sources onto a front surface of the substrate, the plurality of light sources being positioned to face the front surface of the substrate such that a space is formed between the plurality of light sources and the front surface of the substrate;
a gas supply device configured to supply a hydrophobization-treatment gas to the substrate and comprising a gas container and a plurality of gas discharge ports, the gas container covering a lower side of the light sources and positioned to face the front surface of the substrate such that a space is formed between the gas container and the front surface of the substrate, the gas container comprising a material through which the thermal radiation light emitted from the light sources is permeated, the plurality of gas discharge ports being positioned on a lower side of the gas container and configured to open toward the substrate;
an exhaust device configured to exhaust the hydrophobization-treatment gas and comprising a gas exhaust outlet formed around a periphery of the substrate;
a lifting device configured to move the substrate such that the lifting device raises and lowers the substrate between the cooling plate and the light sources; and
a control device comprising circuitry configured to control the light irradiation device, the gas supply device, the exhaust device and the lifting device,
wherein the circuitry of the control device is configured to execute a first gas supply control in which the lifting device, the gas supply device and the exhaust device are controlled such that in a position that the substrate is lowered to the cooling plate, a hydrophobization-treatment gas of a first gas supply process is discharged into the space between the gas container and the substrate and exhausted from the space between the gas container and the substrate, and after the first gas supply control, execute a second gas supply control in which the light irradiation device, the lifting device, the gas supply device and the exhaust device are controlled such that in a position that the substrate is raised to the light sources, the light sources emit the thermal radiation light upon the substrate, a hydrophobization-treatment gas of a second gas supply process is discharged into the space between the gas container and the substrate and exhausted from the space between the gas container and the substrate.

2. The hydrophobization treatment apparatus according to claim 1, wherein the circuitry of the control device is configured to control the exhaust device such that an exhaust ratio of the hydrophobization-treatment gas in the second gas supply control is smaller than an exhaust ratio of the hydrophobization-treatment gas in the first gas supply control.

3. The hydrophobization treatment apparatus according to claim 2, wherein t the circuitry of the control device is configured to control the light irradiation device such that in the second gas supply control, a light irradiation amount of the light sources facing a center portion of the substrate is greater than a light irradiation amount of the light sources facing a peripheral portion of the substrate.

4. The hydrophobization treatment apparatus according to claim 2, wherein the circuitry of the control device is configured to execute a gas exchange control in which the gas supply device and the exhaust device are controlled such that after supplying the hydrophobization-treatment gas in the second gas supply control, an inert gas is discharged into the space between the gas container and the substrate in the position that the substrate is raised to the light sources, and the inert gas and the hydrophobization-treatment gas in the second gas supply control are exhausted from the space between the gas container and the substrate.

5. The hydrophobization treatment apparatus according to claim 2, wherein the gas container has a buffer space formed inside the gas container and communicated to the gas exhaust outlet such that t buffer space accommodates gas.

6. The hydrophobization treatment apparatus according to claim 2, wherein the lifting device comprises a lift body having an annular shape corresponding with a peripheral portion of the substrate such that the lifting device is configured to raise and lower the substrate by supporting the substrate with the lift body.

7. The hydrophobization treatment apparatus according to claim 1, wherein the circuitry of the control device is configured to control the light irradiation device such that in the second gas supply control, a light irradiation amount of the light sources facing a center portion of the substrate is greater than a light irradiation amount of the light sources facing a peripheral portion of the substrate.

8. The hydrophobization treatment apparatus according to claim 7, wherein the circuitry of the control device is configured to execute a gas exchange control in which the gas supply device and the exhaust device are controlled such that after supplying the hydrophobization-treatment gas in the second gas supply control, an inert gas is discharged into the space between the gas container and the substrate in the position that the substrate is raised to the light sources, and the inert gas and the hydrophobization-treatment gas in the second gas supply control are exhausted from the space between the gas container and the substrate.

9. The hydrophobization treatment apparatus according to claim 3, wherein the gas container has a buffer space formed inside the gas container and communicated to the gas exhaust outlet such that t buffer space accommodates gas.

10. The hydrophobization treatment apparatus according to claim 1, wherein the circuitry of the control device is configured to execute a gas exchange control in which the gas supply device and the exhaust device are controlled such that after supplying the hydrophobization-treatment gas in the second gas supply control, an inert gas is discharged into the space between the gas container and the substrate in the position that the substrate is raised to the light sources, and the inert gas and the hydrophobization-treatment gas in the second gas supply control are exhausted from the space between the gas container and the substrate.

11. The hydrophobization treatment apparatus according to claim 1, wherein the gas container has a buffer space formed inside the gas container and communicated to the gas exhaust outlet such that t buffer space accommodates gas.

12. The hydrophobization treatment apparatus according to claim 1, wherein the lifting device comprises a lift body having an annular shape corresponding with a peripheral portion of the substrate such that the lifting device is configured to raise and lower the substrate by supporting the substrate with the lift body.

13. A method for applying hydrophobization treatment on a substrate, comprising:
discharging a hydrophobization-treatment gas of a first gas supply process into a space formed between a gas container facing a front surface of a substrate and the substrate in a position that the substrate is lowered to a cooling plate;
exhausting the hydrophobization-treatment gas of the first gas supply process from the space between the gas container and the substrate;
discharging a hydrophobization-treatment gas of a second gas supply process into the space formed between the gas container and the substrate in a position that the substrate is raised to the light sources and the light sources are emitting the thermal radiation light upon the substrate; and
exhausting the hydrophobization-treatment gas of the second gas supply process from the space between the gas container and the substrate,
wherein the hydrophobization-treatment gas of the second gas supply process is discharged after the hydrophobization-treatment gas of the first gas supply process is exhausted.

14. The method for applying the hydrophobization treatment according to claim 13, wherein the substrate is positioned in a hydrophobization treatment apparatus, and the hydrophobization treatment apparatus comprises a cooling device configured to cool the substrate and comprising a cooling plate positioned to face a back surface of the substrate, a light irradiation device comprising a plurality of light sources and configured to irradiate thermal radiation light emitted from the plurality of light sources onto a front surface of the substrate, the plurality of light sources being positioned to face the front surface of the substrate such that a space is formed between the plurality of light sources and the front surface of the substrate, a gas supply device configured to supply a hydrophobization-treatment gas to the substrate and comprising a gas container and a plurality of gas discharge ports, the gas container covering a lower side of the light sources and positioned to face the front surface of the substrate such that a space is formed between the gas container and the front surface of the substrate, the gas container comprising a material through which the thermal radiation light emitted from the light sources is permeated, the plurality of gas discharge ports being positioned on a lower side of the gas container and configured to open toward the substrate, an exhaust device configured to exhaust the hydrophobization-treatment gas and comprising a gas exhaust outlet formed around a periphery of the substrate, a lifting device configured to move the substrate such that the lifting device raises and lowers the substrate between the cooling plate and the light sources, and a control device comprising circuitry configured to control the light irradiation device, the gas supply device, the exhaust device and the lifting device, the circuitry of the control device is configured to execute a first gas supply control in which the lifting device, the gas supply device and the exhaust device are controlled such that in a position that the substrate is lowered to the cooling plate, a hydrophobization-treatment gas of a first gas supply process is discharged into the space between the gas container and the substrate and exhausted from the space between the gas container and the substrate, and after the first gas supply control, execute a second gas supply control in which the light irradiation device, the lifting device, the gas supply device and the exhaust device are controlled such that in a position that the substrate is raised to the light sources, the light sources emit the thermal radiation light upon the substrate, a hydrophobization-treatment gas of a second gas supply process is discharged into the space between the gas container and the substrate and exhausted from the space between the gas container and the substrate.

15. The method for applying the hydrophobization treatment according to claim 14, wherein the second gas supply control includes controlling the light irradiation device such that a light irradiation amount of the light sources facing a center portion of the substrate is greater than a light irradiation amount of the light sources facing a peripheral portion of the substrate.

16. The method for applying the hydrophobization treatment according to claim 14, further comprising:
discharging an inert gas is discharged into the space between the gas container and the substrate in the position that the substrate is raised to the light sources after the supplying of the hydrophobization-treatment gas of the second gas supply process; and
exhausting the inert gas and the hydrophobization-treatment gas of the second gas supply process from the space between the gas container and the substrate.

17. The method for applying the hydrophobization treatment according to claim 14, wherein the gas container has a buffer space formed inside the gas container and communicated to the gas exhaust outlet such that t buffer space accommodates gas.

18. The method for applying the hydrophobization treatment according to claim 14, wherein the lifting device comprises a lift body having an annular shape corresponding with a peripheral portion of the substrate such that the lifting device is configured to raise and lower the substrate by supporting the substrate with the lift body.

19. The method for applying the hydrophobization treatment according to claim 13, wherein the exhausting of the hydrophobization-treatment gas of the second gas supply process comprises exhausting the hydrophobization-treatment gas of the second gas supply process such that an exhaust ratio of the hydrophobization-treatment gas of the second gas supply process is smaller than an exhaust ratio of the hydrophobization-treatment gas of the first gas supply process.

20. A non-transitory computer readable medium having stored thereon a program that when executed by the control device of the hydrophobization treatment apparatus of claim 1 causes the control device to execute a method for applying hydrophobization treatment on the substrate, comprising:
discharging the hydrophobization-treatment gas of the first gas supply process into the space formed between the gas container facing the front surface of the substrate and the substrate in the position that the substrate is lowered to the cooling plate;
exhausting the hydrophobization-treatment gas of the first gas supply process from the space between the gas container and the substrate;

discharging the hydrophobization-treatment gas of the second gas supply process into the space formed between the gas container and the substrate in a position that the substrate is raised to the light sources and the light sources are emitting the thermal radiation light upon the substrate; and exhausting the hydrophobization-treatment gas of the second gas supply process from the space between the gas container and the substrate.

\* \* \* \* \*